United States Patent [19]

Cothier et al.

[11] 4,235,347

[45] Nov. 25, 1980

[54] AIR-TIGHT MOLDED RESIN ENCLOSURE WITH A SAFETY MEMBRANE FOR ELECTRIC DEVICES

[75] Inventors: René Cothier, Sainte-Adresse; Sylvain Cagnioux, Le Havre, both of France

[73] Assignee: CEM Compagnie Electro-Mecanique, Paris, France

[21] Appl. No.: 27,398

[22] Filed: Apr. 5, 1979

[30] Foreign Application Priority Data

Apr. 21, 1978 [FR] France ................................ 78 11862

[51] Int. Cl.³ .................... F16K 13/04; F16K 17/40; H05K 5/06
[52] U.S. Cl. ............................. 220/89 A; 137/68 R; 174/17 LF; 174/17 VA; 174/52 S
[58] Field of Search ............................. 220/89 A, 207; 137/68 R; 200/150 H; 174/17 LF, 17 VA, 11 R, 50.57, 52 S; 429/53, 56

[56] References Cited

U.S. PATENT DOCUMENTS

| | | | |
|---|---|---|---|
| 1,964,684 | 6/1934 | Clark | 174/17 VA |
| 3,005,773 | 10/1961 | Dawson et al. | 220/89 A |
| 3,039,482 | 6/1962 | Goldberg | 220/89 A X |
| 3,401,314 | 9/1968 | Steele, Jr. | 429/56 X |
| 3,826,412 | 7/1974 | Kneusel | 222/397 |
| 3,866,095 | 2/1975 | Marmorek | 174/50.57 |

OTHER PUBLICATIONS

Industrial and Engineering Chemistry, vol. 39, No. 3, Mar. 1947, pp. 238-242: "Scientific and Utilitarian Value of Florine Chemistry" by J. H. Simons.

*Primary Examiner*—Allan N. Shoap
*Attorney, Agent, or Firm*—Burns, Doane, Swecker & Mathis

[57] ABSTRACT

An air-tight molded resin enclosure for containing a fluid under pressure is disclosed. The enclosure includes a safety membrane which can rupture at a fluid pressure less than the pressure at which the enclosure will rupture. The enclosure may contain an electric device such as a circuit breaker and a pressurized insulating fluid such as sulfur-hexafluoride ($SF_6$) gas. When an electric arc occurs in the circuit breaker, the pressure of the gas contained in the enclosure increases in magnitude. When a sizable over-pressure exists inside the air-tight enclosure, the safety membrane will rupture without damage to the circuit breaker or to any neighboring equipment. The safety membrane includes grooves which act as rupturing primers. The thickness of the safety membrane and the depth of the grooves determine the pressure at which the safety membrane will rupture.

8 Claims, 6 Drawing Figures

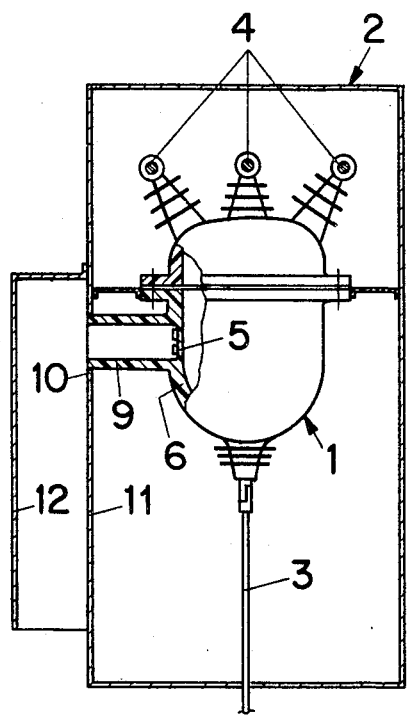
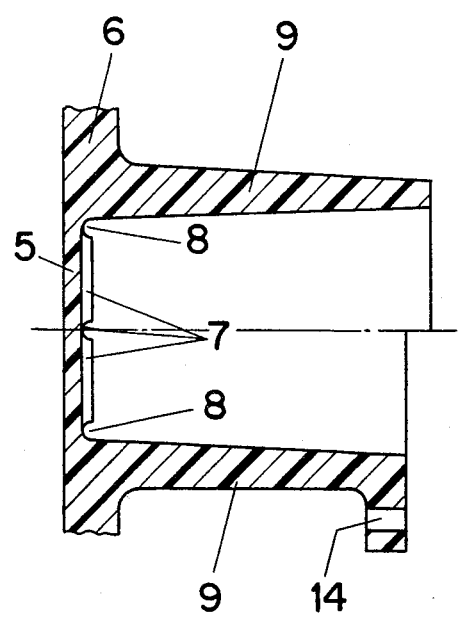
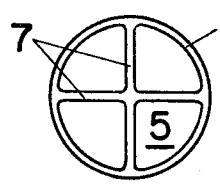
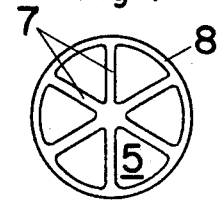
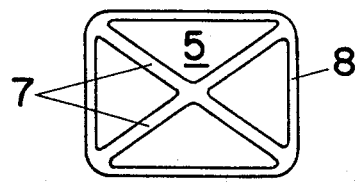
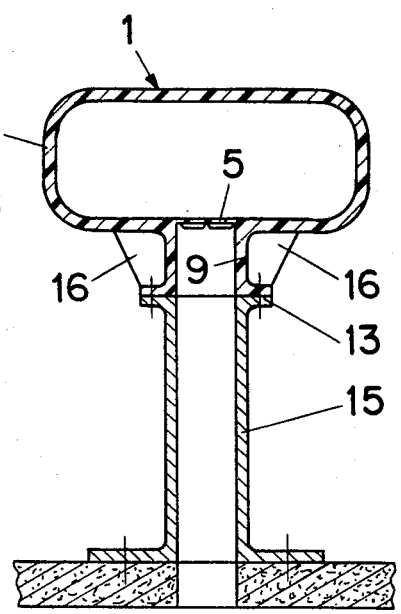

AIR-TIGHT MOLDED RESIN ENCLOSURE WITH A SAFETY MEMBRANE FOR ELECTRIC DEVICES

BACKGROUND AND SUMMARY OF THE INVENTION

This invention relates generally to fluid chambers for enclosing electrical devices, and more particularly to safety devices for relieving fluid pressure in a chamber, if the pressure suddenly increases.

In electric devices used to cut off electric current, such as circuit breakers, commutators and disconnecting switches, the electric current path is broken within an air-tight enclosure containing an insulating fluid under pressure such as sulfur-hexafluoride ($SF_6$). As the current path is broken, an arc is drawn. The arc can produce a sizable over-pressure inside the air-tight enclosure. The over-pressure may result for several reasons, such as failure of the electric arc to extinguish at the time of opening of the contacts; failure of the controlling device resulting in insufficient speed of the movable contacts at the opening or at the closing, or insufficient movement of the movable contacts; and untimely lowering of the pressure of the insulating fluid inside the enclosure due to leaks for example, which result in a diminution of the insulation between the parts under electric tension.

The over-pressures generated by the aforementioned failures can be significant, particularly if the failures lead to a non-breaking or to short-circuiting between phases. When over-pressures occur, the enclosure can explode, damaging not only the electric device contained in the enclosure and the neighboring equipment, but also injuring personnel in the area. Therefore explosion of the enclosure must be avoided.

In order to reduce the damage resulting from over-pressure, it is known in the art to include one or more safety membranes on the air-tight enclosure of current-breaking devices. The safety membranes are generally made of metallic or carbon disks which are generally connected with the interposition of sealing washers to an opening provided in the wall of the air-tight enclosure. The safety membrane ruptures at about an acceptable maximum fluid pressure at which no danger is presented to the enclosure. However, such safety membranes are not always effective because the pressure which causes their rupture depends to a great extent on the rate of the increase of the pressure and on the elasticity of the membrane. Further, in spite of the presence of sealing washers on both sides of the safety membrane, the seals constitute additional sources of fluid leakage which can result in insulation failure during operation of the electric device.

Air-tight molded resin enclosures are known in which the safety membranes consisting of a flat part are set up in a convex cover and therefore are less resistant to the fluid pressure than the convex parts of the cover. However, this arrangement does not prevent damage to the neighboring equipment in the event that over-pressure causes the membrane to rupture. If the current-breaking device which causes the rupture to occur is located in a cell, the neighboring cells are also damaged.

It is therefore an object of this invention to provide an air-tight molded resin enclosure having a safety membrane which can rupture at a specific pressure, and which ruptures in such a manner as to avoid damage to the neighboring equipment.

According to a preferred embodiment of the present invention, the air-tight enclosure includes a tubular flange molded in one piece with the enclosure. The area of the enclosure at which the flange is joined includes a flat part which forms the safety membrane. The flat part forming the safety membrane has a thickness less than the thickness of the rest of the enclosure. Further, a groove in the shape of a closed loop may be formed by molding all around the safety membrane between the membrane and the base of the external flange. A plurality of grooves could extend from the center of the safety membrane all the way to the closed loop shaped groove. In this way, the rupturing pressure of the safety membrane could be much lower than the rupturing pressure of the enclosure. Further, this arrangement is especially attractive when using fragile material having a low elasticity limit because the speed of propagation of the rupture is high. Additionally, if the safety membrane ruptures under internal over-pressure, the external tubular flange permits the fragments of the safety membrane as well as the hot fluid under pressure which has caused the rupture to be directed in a pre-determined direction thereby preventing danger to personnel and neighboring equipment.

According to another embodiment of the present invention, the external tubular flange may be provided on its external end with a connecting clamp molded in one piece with the enclosure and the flange. In this embodiment the flange may be attached through its connecting clamp to a tubular leg which may be used both as a support for the air-tight enclosure and as a conduit for the evacuation of the hot-fluid under pressure in case of rupturing of the safety membrane.

BRIEF DESCRIPTION OF THE DRAWINGS

These preferred embodiments of the invention are illustrated in the accompany drawings wherein like members bear like reference numerals and where:

FIG. 1 is an elevational view, partially in cross-section, illustrating the air-tight enclosure;

FIG. 2 is a cross-sectional view illustrating the safety membrane and the external flange of the air-tight enclosure;

FIGS. 3-5 are plan views illustrating various shapes of the safety membrane; and FIG. 6 is a vertical cross-sectional view illustrating a second embodiment of the air-tight enclosure wherein the external flange and its connecting clamp are also used as a support for the air-tight enclosure.

DETAILED DESCRIPTION OF THE PREFERRED EMBODIMENTS

With reference to FIG. 1, an air-tight enclosure 1 of an electric device for cutting off current, such as a circuit breaker, is illustrated in a cell 2. The circuit breaker is electrically connected in a normal manner to a set of electrical cables 3 (only one cable is illustrated) and to a set of bars 4 which connect several adjacent cells.

The air-tight enclosure 1 is constructed of molded resin in a manner known in the art. The enclosure contains an insulating fluid under pressure such as sulfur-hexafluoride ($SF_6$) gas in addition to the fixed and movable contacts of the electric circuit breaker.

The air-tight enclosure 1 includes a safety membrane 5 which has been molded in one piece with a wall 6 of the enclosure 1. With reference to FIG. 2, the safety membrane 5 is formed as a flat integral part of the wall 6. The safety membrane is preferably of a lesser thickness than the average thickness of the wall 6. In order that the flat safety member 5 rupture at a specific pressure clearly lower than the rupture pressure of the wall 6 in the event of over-pressure within the air-tight enclosure 1, a plurality of grooves 7 are included on one of the two faces of the flat safety member. The grooves act as rupturing primers. Another groove 8, shaped like a closed loop, is also included around the periphery of the flat safety membrane 5 between the flat part of the safety membrane and the base of an external flange 9. The grooves 7 and 8 are preferably included on the external face of the safety membrane. The manner of making the grooves is known to those skilled in the art.

The flat safety membrane 5 and the groove 8 may have a circular outline as illustrated in FIGS. 3 and 4. The grooves 7 then preferably extend radially from the center of the safety membrane 5 up to the circular groove 8. The outline of the safety membrane 5 and of the closed loop shaped groove 8 may have other shapes such as the rectangular shape illustrated in FIG. 5. When the safety membrane is rectangular, the grooves 7 preferably follow the diagonals of the rectangular outline of the safety membrane.

The wall 6, the safety membrane 5 with its grooves 7 and 8 and the external flange 9 are all formed directly by the shape of the mold itself when the air-tight enclosure 1 is molded. It is thus possible to achieve an extremely high precision for the respective thicknesses of the wall 6 and the safety membrane 5 as well as for the depth of the grooves 7 and 8. Through an appropriate selection of the thickness of the safety membrane 5 and of the depth of the grooves 7 and 8, it is possible to cause the membrane 5 to rupture at a specific pre-determined pressure in the event of accidental over-pressure of the fluid within the air-tight enclosure 1. Further, the grooves 7 and 8 cause the rupture to occur very quickly, before the value of the fluid pressure reaches the value of pressure at which the wall 6 of the enclosure 1 will rupture.

With reference to FIG. 1, the external flange 9 must be long enough to extend all the way to an opening 10 provided in a wall 11 of the cell 2 in which the electric circuit breaker is located. Thus, in case of accidental rupture of the safety membrane 5 because of an internal over-pressure due to short-circuits or to the failure to extinguish an electric arc at the time of opening of the contacts for example, the fragments of the safety membrane 5 and the hot gas under pressure are directed and evacuated out of the cell 2 through the bore of the flange 9 without damage to the personnel or to the neighboring equipment and cells. In addition, the hot gas under pressure may be cooled off in an evacuation duct 12 and evacuated through the duct, toward an evacuation area where the personnel have no access during circuit breaker operation.

With reference to FIG. 2, the external flange 9 may include on its external end a connecting clamp 13. The connecting clamp 13 is molded in one piece with the flange and includes a plurality of holes 14 to accommodate fastening screws and bolts. Thus, instead of the flange 9 slidably engaging the opening 10 of the wall 11, the flange 9 may be connected by means of screws to the wall 11 or directly to the evacuation duct 12.

With reference to FIG. 6, another embodiment of the present invention is illustrated. In this embodiment the clamp 13 and the flange 9 mechanically support the air-tight enclosure 1. The flange 9 is connected by means of the clamp 13 to a mating clamp included on a tubular leg 15. The tubular leg 15 is used both as a support for the enclosure 1 and as an evacuation duct which conducts the hot gas under pressure toward a channel in case of rupture of the safety membrane. A plurality of gussets 16 which are molded in one piece with the wall 6 of the air-tight enclosure 1 and the flange 9 provide mechanical reinforcement.

The integration of the safety membrane into the wall of the air-tight enclosure and into the molded flange permits realization of a perfectly air-tight enclosure and realization of a reliable pressure at which the safety membrane will rupture. Additionally, the flange serves to protect the safety membrane from damage during handling of the device. Furthermore, the relationship between the exploding pressure of the enclosure and the rupturing pressure of the safety membrane does not depend on the quality of the resin used for the molding of the enclosure.

The present invention has been described in relation to its application to a particular electric device, namely a circuit breaker. However, the present invention is equally applicable to other electric devices such as high voltage transformers and high voltage capacitors when such devices are placed in an insulating fluid under pressure. In general, the present invention is applicable to any air-tight enclosure containing a fluid under pressure where it is desired to prevent an uncontrolled explosion of the air-tight enclosure as a result of an accidental internal over-pressure.

Modifications and variations of the present invention are possible in light of the above teachings. It is therefore to be understood that within the scope of the appended claims the invention may be practiced otherwise than as specifically described, and that all the matter contained in the above description and shown in the accompanying drawings shall be considered as illustrative and not in a limiting sense.

What is claimed:

1. An air-tight molded resin enclosure for a fluid under pressure, comprising:
   a wall forming at least part of said enclosure;
   a safety membrane integral molded with a portion of said wall;
   means for priming a rupture of said membrane at a fluid pressure less than the pressure required to rupture the wall of the enclosure, said means for priming including:
      a peripheral groove which follows the periphery of said safety membrane, and
      a plurality of radial grooves which extend outwardly from the center of said safety membrane to said peripheral groove,
   wherein said peripheral and radial grooves are in one face of said safety membrane; and
   an external tubular flange, integrally molded with the wall and extending outwardly from the wall, said flange being joined to said wall at the peripheral groove and said flange being aligned with said peripheral groove such that said flange is separated from the safety membrane by said peripheral groove,
   wherein said safety membrane, said peripheral groove, said plurality of radial grooves and said external flange are all formed when said wall is molded, and are all formed directly by the shape of the mold used to mold said wall, whereby the safety membrane ruptures before the wall ruptures when the fluid pressure in the enclosure is increased, and further whereby, upon rupture of the safety membrane the fluid contained under pressure in the enclosure flows through the ruptured membrane and through the external flange.

2. The enclosure according to claim 1 wherein the safety membrane is circular and the peripheral groove follows the circular outline of the safety membrane and the radial grooves follow radii of the circular outline of the safety membrane.

3. The enclosure according to claim 1 wherein the safety membrane is rectangular, and the peripheral groove follows the rectangular outline of the safety membrane and the radial grooves follow the diagonals of the rectangular outline of the safety membrane.

4. The enclosure according to claim 1 wherein the safety membrane is made from material having a low elasticity limit so that the speed of propagation of rupturing is high.

5. The enclosure according to claim 1 further comprising:
   an evacuation duct for conducting the fluid away from the enclosure, said duct being in fluid communication with said external flange,
   whereby upon rupture of the safety membrane the fluid contained under pressure in the enclosure flows through the ruptured membrane, through the external flange and through the evacuation duct.

6. The enclosure according to claim 1 further comprising:
   a tubular support member, said support member being in fluid communication with said external flange; and
   means for connecting said support member to said external flange such that said support member and said external flange are in fluid communication,
   whereby the enclosure is mechanically supported by said external flange, and further whereby, upon rupture of the safety membrane the fluid contained under pressure in said enclosure flows through the ruptured membrane, through said external flange and through said support member.

7. The enclosure according to claim 1 further comprising:
   a plurality of gussets, said gussets being molded in one piece with the wall and the external tubular flange joined thereto,
   whereby said gussets mechanically reinforce said wall and said external flange joined thereto.

8. An air-tight molded resin enclosure for a fluid under pressure, comprising:
   a wall forming at least part of said enclosure;
   a safety membrane integrally molded with a portion of said said wall;
   means for priming a rupture of said membrane at a fluid pressure less than the pressure required to rupture the wall of the enclosure, said means for priming including:
   a peripheral groove which follows the periphery of said safety membrane, and
   a plurality of radial grooves which extend outwardly from the center of said safety membrane to said peripheral groove;
   an external tubular flange integrally molded with the wall and extending outwardly from the wall, said flange being joined to said wall at the peripheral groove and said flange being aligned with said peripheral groove such that said flange is separated from the safety membrane by said peripheral groove;
   a tubular support member, said support member being in fluid communication with said external flange; and
   means for connecting said support member to said external flange such that said support member and said external flange are in fluid communication,
   the enclosure being mechanically supported by said external flange; whereby the safety membrane ruptures before the wall ruptures when the fluid pressure in said enclosure is increased; and further whereby, upon rupture of said safety membrane the fluid contained under pressure in said enclosure flows through the ruptured membrane, through said external flange and through said support member.

* * * * *